United States Patent [19]

Yanagisawa

[11] Patent Number: 5,226,011

[45] Date of Patent: Jul. 6, 1993

[54] STATIC TYPE RAM

[75] Inventor: Kazumasa Yanagisawa, Kokubunji, Japan

[73] Assignee: Hitachi, Ltd., Tokyo, Japan

[21] Appl. No.: 646,907

[22] Filed: Jan. 28, 1991

[30] Foreign Application Priority Data

Feb. 2, 1990 [JP] Japan .................................. 2-24161

[51] Int. Cl.[5] ............................................. G11C 13/00
[52] U.S. Cl. ............................... 365/189.05; 365/182; 365/230.08; 365/233
[58] Field of Search ............... 365/182, 189.01, 189.05, 365/193, 233, 230.08

[56] References Cited

U.S. PATENT DOCUMENTS 5,138,579 8/1992 Tatsumi et al. ...................... 365/203

Primary Examiner—Terrell W. Fears
Attorney, Agent, or Firm—Pennie & Edmonds

[57] ABSTRACT

A static type RAM performs latch of supplied address signals by rise or fall edge of clock pulses supplied from the outside, and performs the write operation continuously while write control signals are activated, and substantially opens a data output terminal in the period. Also an address buffer of the RAM is activated by a definite time required for the state that the supplied address signals are latched by timing pulses formed based on the clock pulses.

20 Claims, 5 Drawing Sheets

STATIC TYPE RAM

BACKGROUND OF THE INVENTION

The present invention relates to a static type RAM (Random Access Memory), and more particularly to an effective technology to be utilized in an ECL (Emitter Coupled Logic) interface by the external clock control.

A conventional ECLRAM controlled by external clock pulse takes a chip select signal $\overline{CS}$, an address signal Ai, a write control signal $\overline{WE}$ and an input data Di in response to the rise of the clock pulse, and starts the write operation. While the clock pulse is at high level, the output is latched and data at the previous cycle remains to be held. If the clock pulse is varied to low level, the latch of the output buffer is released and new state is outputted to the outside.

In such conventional ECLRAM, if a signal latched at the rise of the above-mentioned clock pulse, such as address signal, can be held only during a definite period before and after the rise of the clock pulse, it is not caught by the state in the time other than the above-mentioned definite period. Thereby even if the variation of the input signal is subjected to time fluctuation, such problem does not occur that access of the memory operation be determined. FIG. 8 shows an example of a timing diagram of the write operation.

Such ECLRAM with a control circuit is exemplified in "Fujitsu semiconductor device data sheet (MBM10476RL)", '89, pp. 871–887.

In the clock control ECLRAM as above described, problems of determination of the operation speed due to the time shift such as skew of an address signal and the erroneous writing are removed. However, it has been made clear by the studying of the present inventors that the clock control ECLRAM has new problems as follows. That is, as a first problem, data held by latch during the write operation are always outputted. Consequently, the I/O common to connect a data input terminal and a data output terminal to the common data bus cannot be adopted. Thereby at installation to a package board such as print board, a bus for data input and a bus for data output are required.

As a second problem, input data are latched in so relatively early timing as that of the address signal. Therefore in a system device such as a processor for transmitting/receiving data to and from a memory, since data are transmitted to the memory early at the beginning of the cycle and received from the memory late at the end of the cycle, it follows that use of the system device is quite difficult. At the worst case, one dummy cycle unnecessary for transmitting/receiving the data to and from the memory must be performed thereby the above-mentioned high speed property cannot be fully utilized.

As a third problem, since the ECL circuit is used, the consumption power becomes relatively large.

SUMMARY OF THE INVENTION

An object of the invention is to provide a static type RAM which makes the input and output terminals of data commonable.

Another object of the invention is to provide a static type RAM which can be treated easily at located state to the system.

Still another object of the invention is to provide a static type RAM having an ELC interface which intends the low consumption power.

The foregoing and other objects and novel features of the invention will become apparent from the description of the specification and the accompanying drawings.

Outline of the typical invention disclosed in the present patent application will be briefly described as follows. An address signal supplied in response to rise edge or fall edge of a clock pulse supplied from the outside is latched, and the write operation is continuously performed while the write control signal is activated, and a data output terminal is substantially opened during the period. The supplied address signal is activated for a definite time required for the latching by the timing pulse formed based on the clock pulse.

According to the above-mentioned means, since the write operation is continued while the write signal is activated, the write data may be inputted so as to secure a definite write time before the write control signal is non-activated. Since the data output is substantially opened during the period, the input and output terminal can be made common. Also since an address buffer to receive the ECL address signal is operated only during a definite period required for the taking, the consumption power becomes low.

DETAILED DESCRIPTION OF THE PREFERRED EMBODIMENTS

Figure 1:
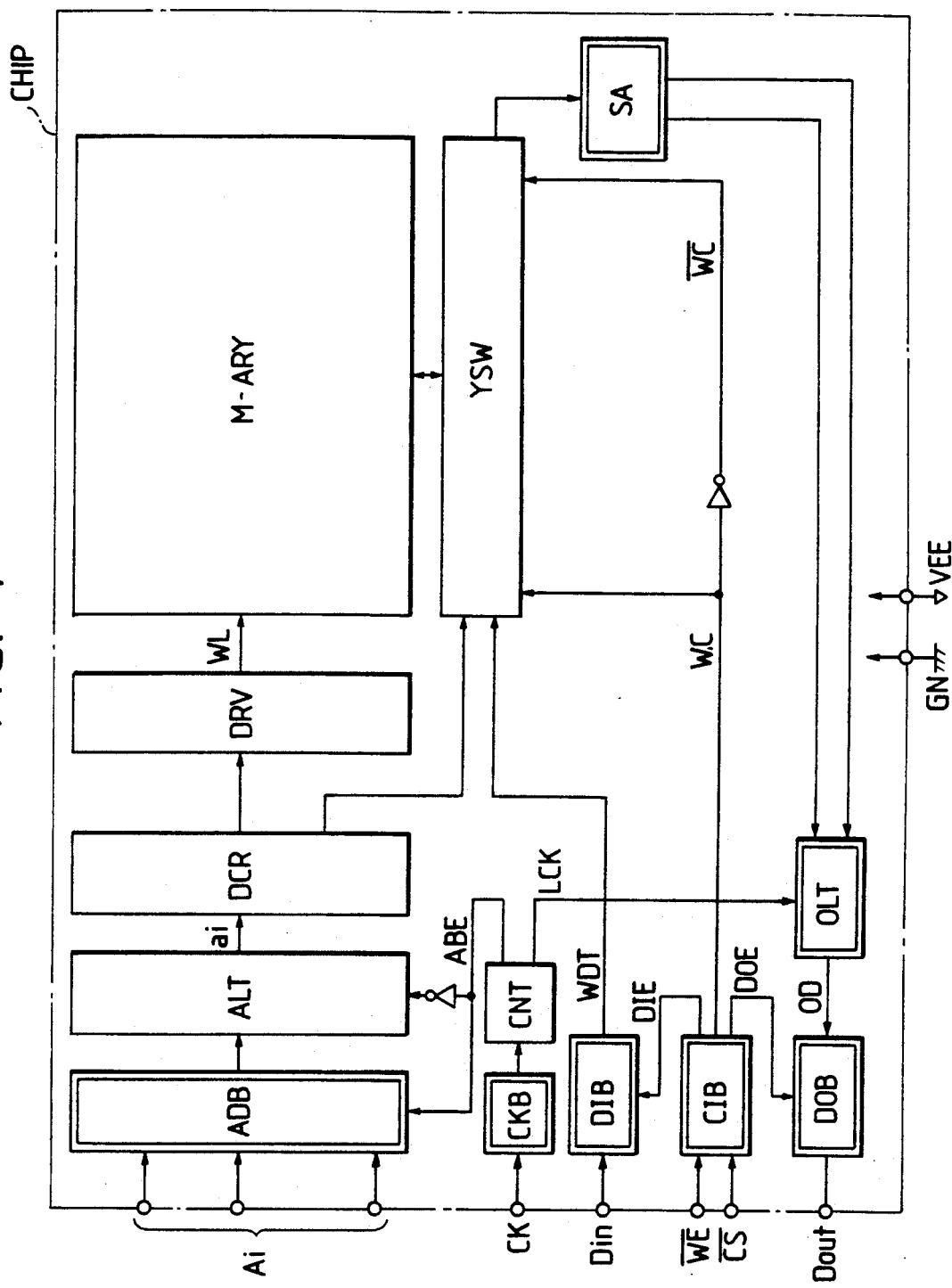
FIG. 1 is a block diagram showing an embodiment of a static type RAM according to the invention.

FIG. 1 is a block diagram of an embodiment of a static type RAM according to the invention. Each circuit block of FIG. 1 is formed on one semiconductor substrate (chip) such as monocrystalline silicon as shown by dash-and-dot line by known manufacturing technology of Bi-CMOS integrated circuit. In this case, the Bi-CMOS integrated circuit is formed in that a plurality of bipolar transistors and a plurality of P and N channel MOSFETs are formed on one semiconductor substrate into a required integrated circuit. Where the CMOS means a complementary MOS circuit formed by the P and N channel MOSFETs.

Signal in an address terminal Ai comprising plural bits is transmitted to an address buffer ADB. The address signal taken in the address buffer ADB is taken in an address latch circuit ALT. The address signal taken in the address latch circuit ALT is transmitted to a decoder DCR and decoded here. A decoder of X series among the decoder DCR decodes an address signal of X series corresponding to this and forms a selective signal of a word line. The word line selective signal is transmitted to a word driver DRV although not particularly limited thereto. Since such a word driver DRV is installed and therefore a number of memory cells are coupled, the word line having relatively large load capacity can be changed in selection/non-selection at high speed.

Figure 6:
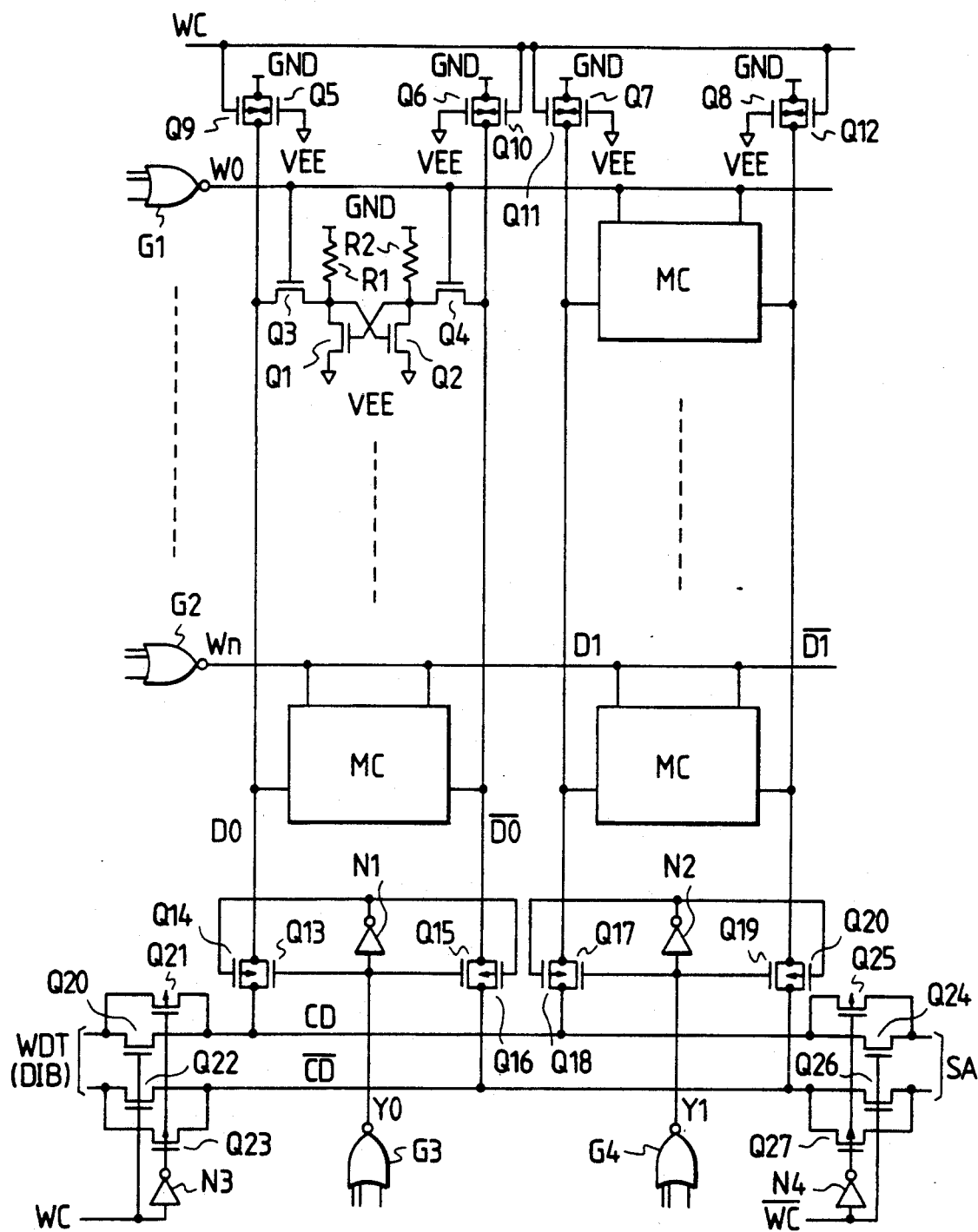
FIG. 6 is a circuit diagram showing an embodiment of a memory array and Y selecting circuit.

A memory array M-ARY is constituted by matrix arrangement of static type memory cells in MOS constitution as shown in FIG. 6 although not particularly limited thereto. That is, the memory cells are arranged on respective intersections between a plurality of data lines and a plurality of word lines.

A decoder of Y series among the decoder DCR decodes an address signal of Y series corresponding to this, and forms a selective signal of a data line, The data line selective signal is transmitted to Y selecting circuit (column switch) YSW. The Y selecting circuit YSW connects a complementary data line of the memory array M-ARY to a complementary common data line CD in accordance with the decoded data line selective signal.

In the RAM of the embodiment, a clock pulse CK is supplied from the outside for the purpose of the high speed and the low consumption power. The clock pulse CK is inputted to a clock buffer CKB. The clock pulse inputted through the clock buffer CKB is inputted to a control circuit CNT. The control circuit CNT generates an address buffer enable signal ABE to control activation of the address buffer ADB and operation of the address latch circuit ALT, and a latch clock LCK to control an output data latch circuit OLT. The address buffer enable signal ABE is supplied to the address decoder ADB and inverted by an inverter circuit and then supplied to the address latch circuit ALT. That is, the address buffer enable signal ABE renders the address latch circuit ALT through state when the address buffer ADB is activated, and renders the address latch circuit ALT latch state when the address buffer ADB is non-activated. The inverter circuit means that the activation of the address buffer ADB and the latch state of the address latch circuit ALT are performed complementarily. The operation of the address buffer ADB is performed only during a definite time required to fetch the address signal Ai supplied from the outside as above described, thereby the DC current consumed in the address buffer ADB is reduced. The latch clock LCK is a timing pulse so as to latch the read data amplified by a sense amplifier to the output data latch circuit OLT.

A data input buffer DIB receives a write signal supplied from an external terminal Din, and forms a complementary write data EDT corresponding to the write signal and transmits it to a Y selecting circuit YSW.

A write enable signal $\overline{WE}$ and a chip select signal $\overline{CS}$ are supplied to a control input buffer CIB, where the logic to decide the operation mode is taken and a data in enable signal DIE, a data out enable signal DOE and a write control signal WC are generated. The data in enable signal DIE is transmitted to a data input buffer DIB and activates a data input buffer DIB. If the data input buffer DIB is activated by the control signal DIE, it takes a write signal from an input terminal Din and forms a complementary write data WDT and transmits the data to the Y selecting circuit YSW. A write control signal WC is transmitted to the Y selecting circuit YSW and forms a write path. The write control signal WC is inverted by the inverter circuit and used also to form a read path. The write control signal WC is a signal approximated to the data in enable signal DIE, but slightly delayed from the data in enable signal DIE in order to satisfy the outer timing. The data out enable signal DOE is non-activated at the fall of the write enable signal $\overline{WE}$, and is activated at the rise of the clock pulse CK. If the write enable signal $\overline{WE}$ is held to low level then, the data out enable signal DOE is maintained in the non-activated state as it is before the fall of next clock pulse CK. The data out enable signal DOE is transmitted to the data output buffer DOB, and if it is non-activated, the output terminal of the data output buffer DOB is substantially made open state.

In the input of the data output buffer DOB, data held to the output data latch circuit OLT are transmitted. In the input of the output data latch circuit OLT, the read data amplified by the sense amplifier SA are inputted.

In addition, the RAM in the embodiment adopts the ECL (emitter coupled logic) interface. The inner circuit is constituted by a CMOS circuit or a Bi-CMOS circuit. Consequently, the level conversion function of converting the ECL level (for example, $-0.8$ V at high level and $-1.7$ V at low level) into the CMOS level (for example, 0 V at high level and $-5.2$ V at low level) is added to the input buffer. On the contrary, the sense amplifier SA, the output data latch circuit OLT and the data output buffer DOB deal with signals of the ECL level although not particularly limited thereto. That is, the read signals after the sense amplifier are transmitted as signals of the ECL level.

In response to that the input buffer and the output buffer are made the ECL constitution as above described, these circuits consume the DC current. On the contrary, inner circuits in the constitution of CMOS and Bi-CMOS do not consume the DC current theoretically. In order to distinguish these, in FIG. 1, each circuit block with the DC current flowing therethrough is represented as double frame.

Figure 2:
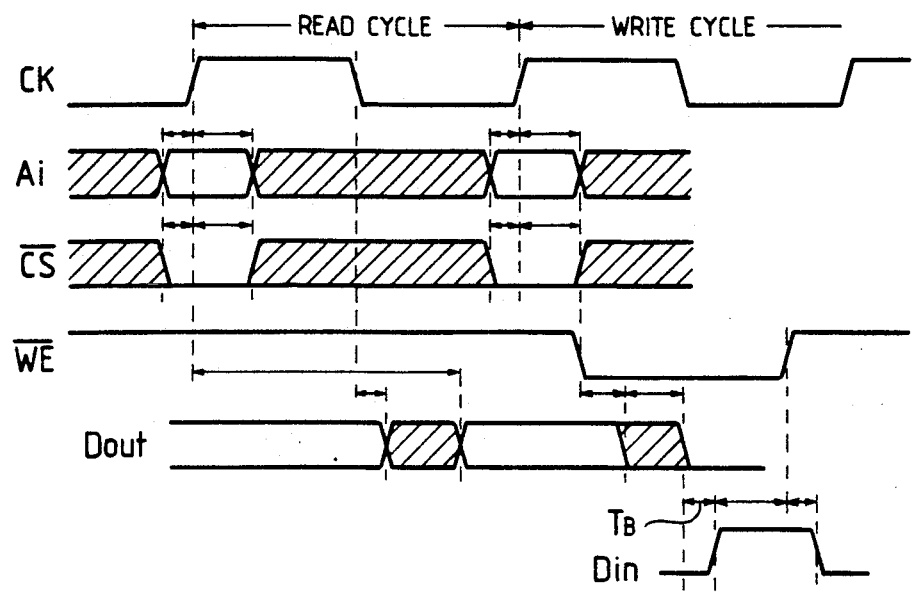
FIG. 2 is a timing waveform chart illustrating an example of the operation.
Figure 3:
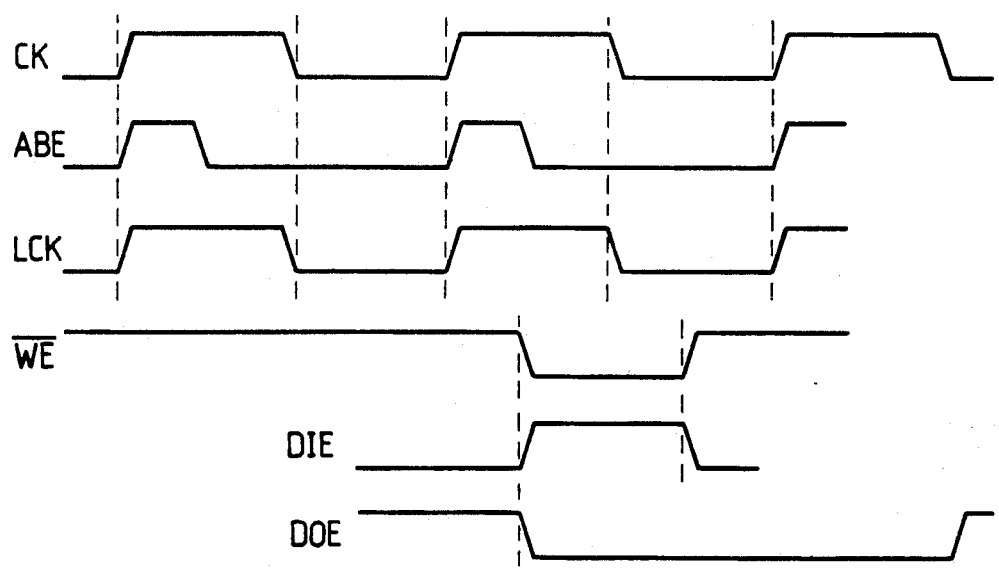
FIG. 3 is an inner timing waveform chart illustrating an example of the operation.

FIG. 2 is a timing waveform chart illustrating an example of operation of the static type RAM, and FIG. 3 is its inner timing waveform chart.

At the rise edge of the clock pulse CK of the ECL level, the address signal Ai of the ECL level and the chip select signal $\overline{CS}$ of the ECL level are taken. Thereby the memory operation is started as follows.

When the clock pulse CK is at high level, since the output data latch circuit OLT performs latch operation by the latch clock LCK, the read data of the preceding cycle (ECL level) is outputted to the output terminal Dout through the data output buffer in the operation state by the high level of the data out enable signal DOE.

The address buffer enable signal ABE is made high level only during a time required for taking input signals such as the address signal. In other words, the address buffer enable signal ABE is varied from high level into low level before the clock pulse CK is made low level. The address buffer ADB is activated while the address buffer enable signal ABE is made high level, and is non-activated by the variation of the address buffer enable signal ABE to low level. Thereby consumption of the DC current in the address buffer ADB receiving the address signal Ai of the ECL level is reduced. Since the address latch circuit ALT performs latch of the taken address signal by the low level of the address buffer enable signal ABE, the selected memory cell is maintained in the selective state as it is.

In the embodiment, the write enable signal $\overline{WE}$ of the ECL level is taken in the inner circuit irrespective of the clock pulse, and if the clock pulse is at high level, decision is effected that the write enable signal WE is at the read cycle. In the read cycle, if the clock pulse CK is varied to low level, the latch clock LCK is varied to low level corresponding to this, and the latch of the output data latch circuit OLT is released and new read data are outputted through the sense amplifier SA.

If the write enable signal $\overline{WE}$ is made low level as in next cycle, decision is effected that the write enable signal WE is at the write cycle.

In the write cycle, since the write enable signal $\overline{WE}$ is at low level, the data in enable signal DIE is made high level and the data out enable signal DOE is made low level. Since the data in enable signal DIE is at high level, a data input buffer DIB is activated and the write data (ECL level) at the input terminal Din are taken, and the write data WDT are transmitted to the Y selecting circuit YSW. Since the data out enable signal DOE is at low level, a data output buffer DOB is made the non-activated state and the output terminal Dout is substantially opened. That is, the output node of the output buffer DOB is made the high impedance state. The data in enable signal DIE is made high level as above described.

Therefore when the common bus system is adopted that the input terminal Din and the output terminal Dout are connected to the common bus, invalid data may be inputted to the input of the data input buffer DIB during the bus changing time $T_B$. However, when the write enable signal $\overline{WE}$ is made high level, the bus changing is performed before the write operation is finished, and the true write signal is transmitted to the input node of the input buffer DIB. Consequently, the invalid data may be possibly written in the memory cell once, but the invalid data is rewritten into the true write data afterwards and any problem does not occur.

Corresponding to that the write enable signal $\overline{WE}$ is made high level, the data in enable signal DIE is varied to low level and the write operation is immediately finished. On the contrary the data out enable signal DOE is still maintained to low level, and is varied to high level by the fall of the clock pulse CK of next cycle.

In next cycle, if the write enable signal $\overline{WE}$ remains high level as above described, the read cycle as above described is executed again.

Figure 4:
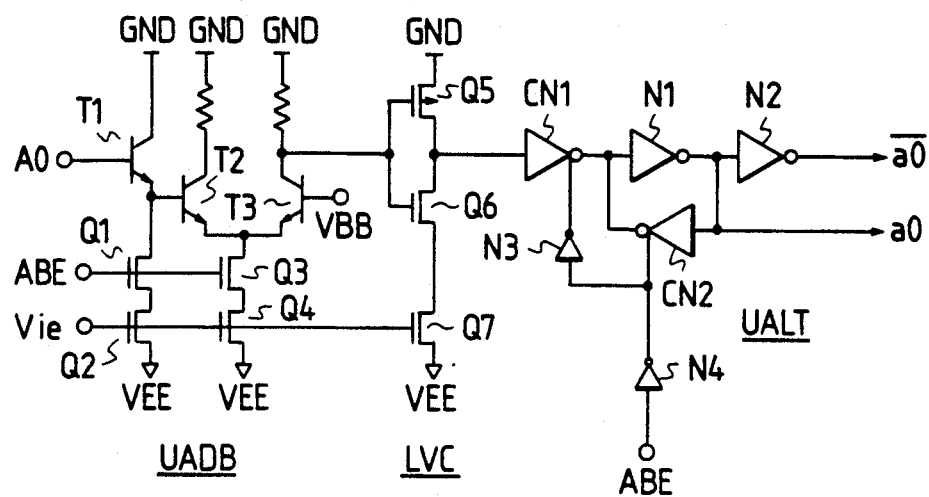
FIG. 4 is a circuit diagram showing an embodiment of a unit circuit of an address buffer and an address latch circuit.

FIG. 4 is a circuit diagram showing an embodiment of a unit circuit of an address buffer and an address latch circuit.

A unit circuit UADB of an address buffer corresponding to an address signal A0 of one bit exemplified as representative is constituted by following circuit elements. The address signal A0 is supplied to base of an emitter follower transistor T1. Collector of the transistor T1 is connected to the ground potential being positive voltage. N-channel MOSFET Q1 acting as a switch and N-channel MOSFET Q2 acting as a constant-current source are installed in series to emitter of the transistor T1. Source of the constant-current MOSFET Q2 is connected to a negative voltage line VEE such as $-5.2$ V.

An emitter output signal of the transistor T1 is supplied to base of a differential transistor T2. Reference voltage VBB to be used for the ECL level decision is supplied to base of a transistor T3 in the differential state with the transistor T2. The reference voltage VBB is formed by a reference voltage generator (not shown).

Load resistors are installed respectively in collectors of the differential transistors T2, T3, and N-channel MOSFET Q3 acting as a switch and N-channel MOSFET Q4 acting as a constant-current source in similar manner to the above description are connected in series to common emitter of the transistors T2, T3. The address buffer enable signal ABE is supplied to gate of each of the MOSFETs Q1 and Q3 as the switch, and constant voltage Vie is supplied to gate of each of the MOSFETs Q2, Q4 as the constant current source so that voltage between gate and source becomes about 1.5 V.

If the address buffer enable signal ABE is high level, the MOSFETs Q1 and Q3 are turned on, and the constant current formed by the constant-current MOSFETs Q2, Q4 flows through the emitter follower transistor T1 and the differential transistors T2, T3. Thus the address buffer is activated, and the address signal A0 is taken. On the contrary, if the address buffer enable signal ABE is varied from high level to low level, the MOSFETs Q1 and Q3 are turned off and the constant current formed by the constant-current MOSFETs Q2, Q4 is cut off. In this case, the output signal is made high level.

Output signal of the unit circuit UADB in the ECL constitution is converted into the CMOS level by a level converter LVC. Although not particularly limited thereto, in the level converter LVC, the output signal of the unit circuit UADB is transmitted to input of a CMOS inverter circuit comprising P-channel MOSFET Q5 and N-channel MOSFET Q6. A constant-current MOSFET Q7 receiving the constant voltage Vie is installed in series to the N-channel MOSFET Q6 of the CMOS inverter circuit. The CMOS inverter circuit (Q5, Q6) amplifies the ECL level and converts it into the CMOS level. If the unit circuit UADB is non-activated then, since the output is fixed to high level, the P-channel MOSFET Q5 is turned off and the N-channel MOSFET Q6 is turned on thereby low level is outputted.

In the unit address latch circuit UALT, although not particularly limited thereto, a through latch circuit including a clocked inverter circuit CN1 as an input circuit and a clocked inverter circuit CN2 as a feedback circuit is used. When the address buffer enable signal ABE is at high level, the through latch circuit is made the through state. That is, output signal of an inverter circuit N4 becomes low level and the output of the clocked inverter circuit CN2 for feedback is made the high impedance state, and the output signal of the inverter circuit N3 becomes high level due to the low level of the output signal of the inverter circuit N4 thereby the clocked inverter circuit CN1 for input is activated. Thereby as the output signal of the level converter LVC, an address signal a0 being non-inverted similar to the outer address signal A0 is outputted through the clocked inverter circuit CN1 and the inverter circuit N1. An address signal $\overline{a0}$ being inverted with respect to the outer address signal A0 is outputted through the inverter circuit N2.

When the address buffer enable signal ABE is at low level, the through latch circuit is made the latch state. That is, the output signal of the inverter circuit N4 becomes high level, and the clocked inverter circuit CN2 for feedback is activated and the output signal of the inverter circuit N1 is fed back to input thereof. Then the output signal of the inverter circuit N3 becomes low level due to the high level of the output signal of the inverter circuit N4, and the output of the clocked inverter circuit CN1 for input is made the high impedance state. Thereby the taken address signal is held irrespective of the output signal of the level converter LVC varying at low level.

The input buffer receiving the chip select signal in FIG. 1 is in similar constitution to that of the above-mentioned address buffer. Also the input buffer receiving the write enable signal $\overline{WE}$ and the input buffer CKB receiving the clock signal CK are in similar constitution to the above description. In this case, however, since the input buffer receiving the signals $\overline{WE}$, CK is normally made the operation state, the terminal for activating signal corresponding to the address buffer enable signal ABE is maintained to the high level potential such as the ground potential of the circuit.

Figure 5:
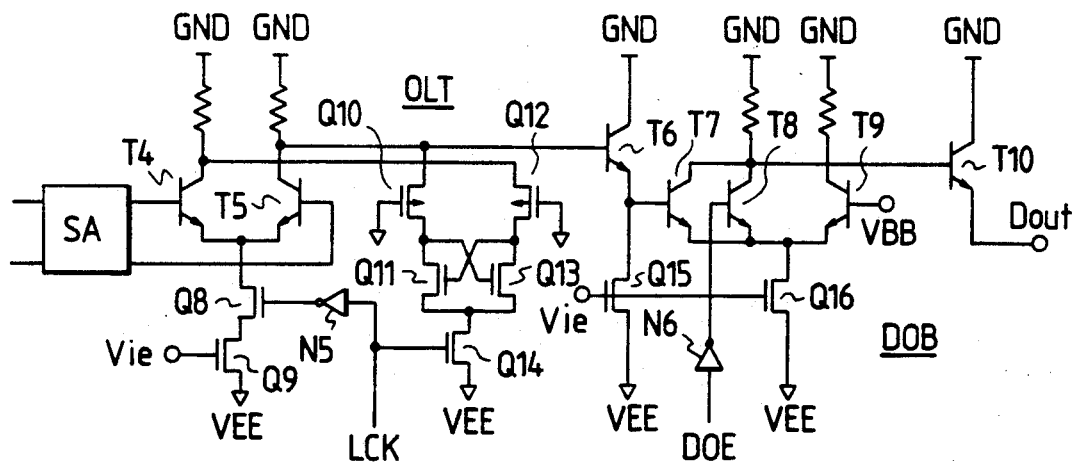
FIG. 5 is a circuit diagram showing an embodiment of an output data latch circuit and a data output buffer.

FIG. 5 is a circuit diagram showing an embodiment of an output data latch circuit OLT and a data output buffer DOB.

Read signals of the ECL level formed by a sense amplifier SA are supplied to bases of differential transistors T4, T5. Load resistors are installed to collectors of these differential transistors T4, T5. N-channel MOSFET Q8 as a switch and N-channel MOSFET Q9 as a constant-current source are installed to common emitter of the differential transistors T4, T5. Constant voltage Vie as above described is supplied to gate of the N-channel MOSFET Q9 as the constant-current source. A latch clock LCK is supplied to gate of the N-channel MOSFET Q8 as the switch through an inverter circuit N5.

Collectors of the differential transistors T4 and T5 are connected through P-channel MOSFETs Q10, Q12 acting as resistance elements to N-channel MOSFETs Q11 and Q13 in the latch state by cross connection of gate and drain. Voltage VEE is supplied steadily to gates of the P-channel MOSFETs Q10 and Q12. N-channel MOSFET Q14 as a switch is installed to common source of the N-channel MOSFETs Q11 and Q13. Source of the MOSFET Q14 is connected to the operation voltage VEE, and the latch clock LCK is supplied to gate of the MOSFET Q14.

When the latch clock LCK is at low level, the switch MOSFET Q14 is turned off. Consequently, the N-channel MOSFETs Q11, Q13 in the latch state are rendered the non-operation state. In this case, since the output signal of the inverter circuit N5 is made high level in response to the low level of the latch clock LCK, the switch MOSFET Q8 is turned on. Since constant current formed by the constant-current MOSFET Q9 flows through the differential transistors T4, T5, the transistors T4, T5 are rendered the operation state and transmit the output signal of the sense amplifier SA to the data output buffer DOB at next stage.

If the latch clock LCK is varied from low level to high level, the switch MOSFET Q14 is turned on and the switch MOSFET Q8 is turned off. Consequently, the operation current of the differential transistors T4, T5 is cut off, and the operation voltage is supplied to the MOSFETs Q11, Q13 in the latch state. Thereby in response to high level or low level of the differential output, one of the MOSFETs Q11 and Q13 in the latch state is turned on or off. Thereby current flows in the load resistor through the N-channel MOSFET Q11 or Q13 and the P-channel MOSFET Q10 or Q12 at the ON state, and signal of low level in the ECL level is formed and held. Since current does not flow in the load resistor corresponding to the N-channel MOSFET in the OFF state, the high level of ECL is formed.

In the data output buffer DOB, although not particularly limited thereto, an input circuit is constituted by an emitter follower circuit comprising a transistor T6 and a constant-current MOSFET Q15. An output signal of the output data latch circuit OLT is supplied through the input circuit to base of one transistor T7 in the differential state with a transistor T9 receiving reference voltage VBB. A transistor T8 is installed in parallel to the transistor T7. A data out enable signal DOE is supplied to base of the transistor T8 through an inverter circuit N6.

The logic block comprising the differential transistors T7–T9 constitutes an OR gate circuit. A constant-current MOSFET Q16 is installed to common emitter of the differential transistors T7–T9. Constant voltage Vie is supplied to gate of the constant-current MOSFETs Q15, Q16.

An output signal of common collector of the differential transistors T7, T8 is supplied to base of an emitter follower output transistor T18. Emitter of the transistor T10 is connected to the output terminal Dout. In addition, emitter of the output transistor T10 is commonly connected to an output terminal of other similar RAM so as to take wired logic. Therefore a load resistor or a constant-current source as a load is installed to side of a package substrate where the RAM is packaged.

When the data out enable signal DOE is at high level, output of the inverter circuit N6 becomes low level and the transistor T8 is turned off. Thereby an output signal of the output data latch circuit OLT is outputted through the transistor T7. If the data out enable signal DOE is varied to low level, output of the inverter circuit N6 becomes high level and the transistor T8 is turned on. Thereby the output signal thereof is made low level irrespective of the output signal of the output data latch circuit OLT. That is, the output terminal Dout is substantially made the open state. In addition, when the data out enable signal DOE is formed by the CMOS level, the inverter circuit N6 also performs the level conversion operation.

FIG. 6 is a circuit diagram showing an embodiment of a memory array M-ARY and a Y selecting circuit YSW as above described. Circuit symbols added to MOSFETs and the like in FIG. 6 are partly overlapped with those in FIGS. 3 to 5, but it should be understood that circuit components in FIG. 6 have circuit function different from those in FIGS. 3 to 5.

The memory array is constituted by a plurality of memory cells MC, word lines W0 to Wn and complementary data lines DO, $\overline{D0}$ to D1, $\overline{D1}$ in matrix arrangement, which are exemplified as representative. Respective memory cells MC are in similar constitution to each other, and one specific circuit shown as representative includes N-channel type storage MOSFETs Q1, Q2 with gate and drain in cross connection to each other and source coupled with the voltage VEE, and high resistors R1, R2 of poly (polycrystalline) silicon layer provided between drain of the MOSFETs Q1, Q2 and the ground point GND of the circuit. N-channel type transmission gate MOSFETs Q3, Q4 are provided between the common junction of the MOSFETs Q1, Q2 and the complementary data lines D0, $\overline{D0}$. Gates of the transmission gate MOSFETs Q3, Q4 of the memory cells arranged on the same row are connected commonly to corresponding word lines W0–Wn exemplified respectively, and input and output terminals of the memory cells arranged on the same column are connected to corresponding pair of complementary data lines (bit lines or digit lines) D0, $\overline{D0}$ and D1, $\overline{D1}$ exemplified respectively.

In the memory cell, the MOSFETs Q1, Q2 and the resistors R1, R2 constitute a sort of flip-flop circuit, but the operating point in the information holding state is significantly different from that of a flip-flop circuit in ordinary meaning. That is, in the memory cell MC, in order to decrease the consumption power, the resistor R1 has a significantly high resistance value so that when the MOSFET Q1 is turned off, the gate voltage of the MOSFET Q2 can be maintained to voltage slightly higher than the threshold voltage. Also the resistor R2 has a high resistance value. In other words, the resistors R1, R2 have so high resistance that the drain leak current of the MOSFETs Q1, Q2 can be compensated. The resistors R1, R2 have the current supply capacity enough to prevent the information charge stored in a gate capacitor (not shown) of the MOSFET Q2 from being discharged.

In accordance with the embodiment, although the selecting circuit is manufactured by the CMOS or Bi-CMOS technology, the memory cell MC is constituted by the N-channel MOSFET and the poly silicon resistance element.

As the memory cell of the static type RAM, the poly silicon resistance elements R1, R2 respectively may be replaced by the P-channel MOSFET. That is, the P-channel MOSFET substituted for the resistor R1 (R2) is provided with a source drain path coupled between drain of the NMOSFET Q1 (Q2) and gate coupled with gate of the NMOSFET Q1(Q2). Such CMOS type memory cell is used, thereby the low consumption power of the memory cell and improvement of the α-ray resistant intensity can be achieved.

In FIG. 6, although not particularly limited thereto, P-channel type load MOSFETs Q5–Q8 acting as resistance elements by steadily supplying the voltage VEE to each gate are installed between each of the complementary data lines D0, $\overline{D0}$ and D1, $\overline{D1}$ and the ground potential GND. These MOSFETs Q5–Q8 are formed in relatively small size and therefore have small conductance. P-channel type load MOSFETs Q9–Q12 are installed in parallel to these load MOSFETs Q5–Q8 respectively. These load MOSFETs Q9–Q12 are formed in relatively large size and therefore have relatively large conductance. Ratio of the resultant conductance of the MOSFETs Q9–Q12 in the ON-state with the MOSFETs Q5–Q8 to the resultant conductance of the transmission gate MOSFET of the memory cell MC and the storage MOSFET is selected to such value that the complementary data lines D0, $\overline{D0}$ and D1, $\overline{D1}$ have required potential difference in accordance with the storage information in the read operation of the memory cell MC. The write control signal WC to be made high level such as the ground potential GND during the write operation is supplied to gate of each of the load MOSFETs Q9–Q12. Thereby the load MOSFETs Q9–Q12 are turned off during the write operation. Consequently, load of the complementary data lines in the write operation becomes only the MOSFETs Q5–Q8 of small conductance thereby the write operation can be performed at high speed.

In FIG. 6, the word line W0 is selected by the X series decoder and the drive circuit DRV as above described, but in order to prevent the drawings from being complicated in FIG. 6, the NOR gate circuit G1 acts also as the X series decoder and the drive circuit DRV. This also applies to the word line Wn exemplified as other representative.

The X series address decoder is constituted by NOR gate circuits G1, G2 similar to each other. To input terminals of these NOR gate circuits G1, G2, an address latch circuit is made the through state through an address buffer ADB receiving the X series outer address signal comprising plural bits, or the held inner address signals are supplied by prescribed combination. In the actual state, the X series decoder is constituted in dividing such as by installing a predecoder, and this is functionally shown by one NOR gate circuit in the embodiment.

CMOS switch circuit comprising N-channel MOSFET Q13 and P-channel MOSFET Q14 in parallel state is installed between the complementary data line D0 and the common complementary data line CD in the memory array. Other data lines $\overline{D0}$ and D1, $\overline{D1}$ are also connected to the corresponding common complementary data lines CD, $\overline{CD}$ by the similar CMOS switch circuit. These CMOS switch circuits constitute the Y selecting circuit YSW.

The selective signals Y0, Y1 respectively formed by the Y series address decoder are supplied to gates of the N-channel type MOSFETs Q12, Q15 and Q17, Q19 to constitute the Y selecting circuit YSW. Output signals of the CMOS inverter circuits N1, N2 receiving the selective signals Y0, Y1 are supplied to gates of the P-channel type MOSFETs Q14, Q16 and Q18, Q20.

The Y series address decoder is constituted by NOR gate circuits G3, G4 in similar constitution to each other. To these NOR gate circuits G3, G4, the address latch circuit is made the through state through the address buffer ADB receiving the Y series outer address signal comprising plural bits, or the held inner address signals are supplied by prescribed combination. In the actual state, the Y series decoder is also constituted in dividing such as by installing a predecoder similarly to the above description, and this is shown functionally by one NOR gate circuit in the embodiment.

Write data WDT being output signals of the data input buffer DIB are supplied to the common complementary data lines CD, $\overline{CD}$ through the CMOS switch circuit comprising N-channel MOSFETs Q20, Q22 and P-channel MOSFETs Q21, Q23. The CMOS switch circuit is switch-controlled by the write control signal WC. At the write operation where the CMOS switch circuit is made high level, the N-channel MOSFETs Q20 and Q22 are turned on, and when the output signal of the inverter circuit N3 is at low level, the P-channel MOSFETs Q21 and Q23 are turned on. Thereby the write data WDT are transmitted to the common complementary data lines CD, $\overline{CD}$, and are written in one memory cell selected by the Y selective signal and the word line selective signal. Then the CMOS switch circuit of the read system as hereinafter described is turned off.

The common complementary data lines CD, $\overline{CD}$ are connected through a CMOS switch circuit comprising N-channel MOSFETs Q24, Q26 and P-channel MOSFETs Q25, Q27 to an input terminal of a sense amplifier SA. The CMOS switch circuit is switch-controlled by the inverted write control signal $\overline{WC}$. At the read operation where the CMOS switch circuit is made high level, the N-channel MOSFETs Q24 and Q26 are turned on, and when the output signal of the inverter circuit N4 is at low level, the P-channel MOSFETs Q25 and Q27 are turned on. Thereby the signals of the common complementary data lines CD, $\overline{CD}$ are transmitted to the input of the sense amplifier SA. Then the CMOS switch circuit of the write system is turned off.

In addition to use of such a CMOS switch circuit, the input terminal of the sense amplifier may be connected directly to the common complementary data lines CD, $\overline{CD}$, and the differential amplifier circuit to constitute the sense amplifier is supplied with inner activation pulse generated for a definite period at the read operation so that the sense amplifier SA performs the amplifying operation by the definite period. Also try state output function including the high impedance state may be added to the output section of the data input buffer DIB to form the write data WDT and control by the write control signal WC is performed, and at state other than the write operation, the output may be made the high impedance state or the floating state.

Figure 7:
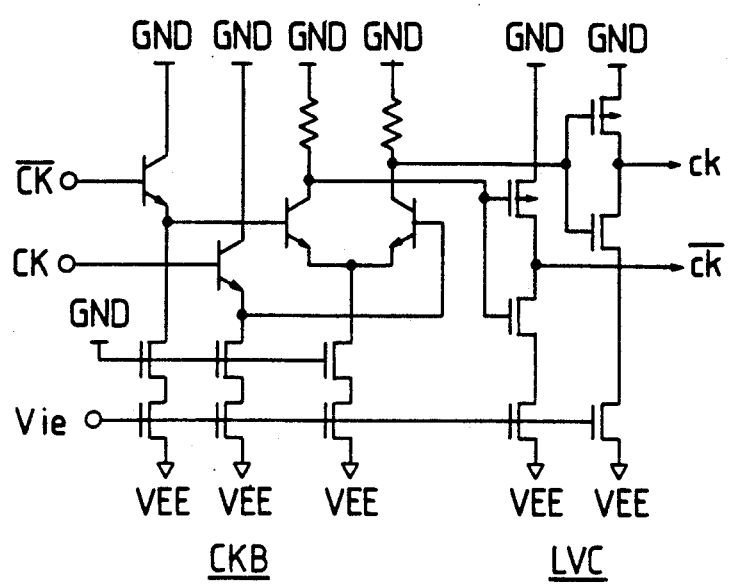
FIG. 7 is a circuit diagram showing another embodiment of a clock buffer.
Figure 8:
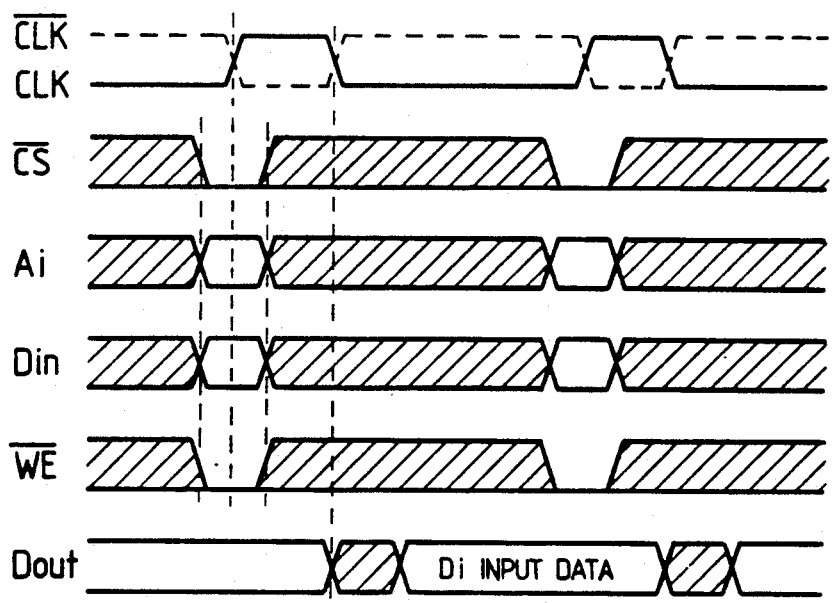
FIG. 8 is a timing waveform chart showing an example of operation of a static type RAM in the prior art.

FIG. 7 is a circuit diagram showing another embodiment of a clock buffer CIB.

In this embodiment, complementary clock pulses CK and $\overline{CK}$ are inputted. An emitter follower circuit is installed to constitute an input circuit in response to such complementary clock pulses CK and CK. The complementary pulses passing through the emitter follower circuit are inputted to base of differential transistors, and its collector output passes through a level converter using a CMOS inverter circuit similar to the above description thereby inner complementary clock pulses ck, $\overline{ck}$ are formed. In this constitution, since the complementary clock pulses CK and $\overline{CK}$ are inputted, the level margin can be taken much. Also since noise of the common node can be canceled by the differential transistor circuit, a strong circuit against the outer noise can be formed. Since N-channel MOSFET installed in series to a constant-current MOSFET to form the operating current of the emitter follower circuit and the differential transistors does not perform the activation selectively as in the case of the address buffer, the high level such as the ground potential GND of the circuit can be supplied.

The static type RAM according to the invention is suitable for use in main storage of a computer system. Consequently, in order to reduce the cost in the static type RAM of the invention, a lead frame is used and a plastic package structure by resin seal is constituted.

Functional effects obtained from the above-mentioned embodiments are as follows.

(1) Latch of a supplied address signal is performed by rise or fall edge of a clock pulse supplied from the outside, and the write operation is performed continuously while a write control signal is activated, and a data output terminal is substantially opened in the period. Thereby the write data may be inputted so that a definite write time is secured before the write control signal is non-activated, and the write within one cycle becomes possible and the input and output terminals can be made common.

(2) According to effect (1), in a package substrate where RAM is packaged, data buses need not be provided for input and output individually and the wiring number of the package substrate can be reduced.

(3) An address buffer is activated by the definite time required for the state that the supplied address signal is latched by a timing pulse formed based on the clock pulse, thereby the consumption power can be reduced. If a CMOS circuit and a Bi-CMOS circuit are used in an inner circuit and an ECL interface is adopted for input and output, in general, the DC current component occupies the total consumption power in such large ratio as 30% to 50% thereof, resulting in large cause to prevent the low consumption power. In the embodiment, however, since the address buffer is operated only intermittently, the consumption can be reduced significantly.

(4) The complementary pulse is inputted as an outer clock pulse, thereby the operation margin can be significantly enlarged.

The invention made by the present inventors has been described specifically based on the embodiments. However, the invention is not limited to the specific embodiments, but it is clear that various changes and modifications may be done without departing from the spirit of the invention. For example, the input/output interface may be that the ECL interface is replaced by a TTL (transistor.transistor logic) interface. In the input buffer receiving the TTL level, a CMOS circuit as it is may be used. Also in the data output buffer outputting the TTL level, such a try state output circuit may be used that during its non-activation, the output terminal is made the high impedance state or the floating state. In the memory array, such a switch MOSFET applying the equalizing may be installed that a clock pulse supplied from the outside is utilized and the complementary data line or the common data line is shortcircuited before selecting the memory cell. Also the word line may be that when the read from the memory cell is performed, the memory cell is made the non-selective level. Thereby the DC current can be prevented from being consumed through the memory cell in the selective state. In the selection operation of such word lines, the clock pulse or a pulse based on the clock pulse can be utilized. In the clock pulse CK supplied from the outside, the pulse width duty need not be made 50% as shown in FIG. 2 or FIG. 3, but may be set smaller or larger if necessary.

Also specific constitution of the inner circuit may be changed variously. The inner circuit may be constituted not only by using the CMOS circuit or the Bi-CMOS circuit but also by an ECL circuit.

The invention can be widely utilized in a self timed RAM where the memory operation is controlled by a clock pulse supplied from the outside.

Effects obtained by the typical invention disclosed in the present patent application will be briefly described as follows. Latch of a supplied address signal is performed by rise or fall edge of a clock pulse supplied from the outside, and the write operation is performed continuously while a write control signal is activated, and a data output terminal is substantially opened in the duration. Thereby the write data may be inputted so that a definite write time is secured before the write control signal is non-activated, and the write within one cycle becomes possible and the input and output terminals can be made common. Also in a package substrate where RAM is packaged, data buses need not be provided for input and output individually and the wiring number of the package substrate can be reduced.

What is claimed is:

1. A semiconductor integrated circuit comprising:
a clock input terminal for receiving an external generated clock signal which change between first and second states at a prescribed period;
address input terminals for receiving external generated address signals;

latch means for latching the external generated address signals inputted to said address input terminals in response to the external generated clock signal changing from the first state to the second state;

at least one memory cell;

a write control signal input terminal for receiving a write control signal, said write control signal having an active state and a non-active state;

a data input terminal;

a data output terminal;

write means for writing data supplied to said data input terminal into said at least one memory cell in response to the write control signal being in the active state, said writing being performed while the write control signal is in the active state; and means for putting said data output terminal into the open state while said write means operates.

2. A semiconductor integrated circuit as set forth in claim 1, wherein said latch means includes address buffer circuits and an address latch circuits, and said semiconductor integrated circuit further comprises a timing control circuit having means for receiving the external generated clock signal and for forming prescribed timing pulses in accordance with said received signal, said address buffer circuits and said address latch circuits having mans for being in an operation state only within the time that the external generated address signals can be latched, based on the timing pulses formed by said timing control circuit.

3. A semiconductor integrated circuit as set forth in claim 1, wherein said semiconductor integrated circuit has an ECL interface.

4. A semiconductor integrated circuit as set forth in claim 1, wherein said data output terminal has a low level when it is in the open state.

5. A semiconductor integrated circuit as set forth in claim 1, wherein said at least one memory cell includes at least one MOSFET.

6. A semiconductor integrated circuit as set forth in claim 5, further comprising a selecting circuit, having means to receive the outputs of said latch means, for making said at least one memory cell in a selective state, said selecting circuit including a plurality of PMOSFETs, NMOSFETs and bipolar transistors.

7. A semiconductor integrated circuit comprising:

means for inputting an external generated clock pulse having a rising and falling edge;

means for inputting an externally generated write control signal which changes between an active and an inactive state;

means for inputting an externally generated data;

means for inputting and latching an externally generated address signal by one of the rising and falling edge of said input externally generated clock pulse;

memory means for holding a data;

means for continuously placing said input externally generated data into said memory means while said input write control signal is in said active state and for generating a data terminal control signal substantially throughout the period of said placement;

data output terminal means for outputting a data from said memory means and having a means for switching, in accordance with said data terminal control signal, into an open output state.

8. A semiconductor integrated circuit as set forth in claim 7, further comprising:

means for generating a plurality of timing pulses in accordance with said input externally generated clock, an address buffer for receiving the externally generated address signals, said address buffer having means for being activated for a definite time, said definite time being in accordance with a predetermined time required for the externally generated address signals to be latched, said activating being in response to timing pulses formed based on the clock pulses.

9. A semiconductor integrated circuit as set forth in claim 7, wherein said semiconductor integrated circuit includes an ECL interface, and said data output terminal is substantially opened by switching said data output terminal to a low level.

10. A semiconductor integrated circuit as set forth in claim 7, further comprising: a plurality of memory cells composed of MOSFETs and a selecting circuit for selecting at least one of said plurality of memory cells, said selecting circuit being composed of Bi-CMOS circuits in combination of CMOS circuits and bipolar transistors.

11. A as set forth in claim 7, wherein the externally generated clock pulses are complementary clock pulses comprising non-inverted pulses and inverted pulses.

12. A semiconductor integrated circuit device according to claim 2, wherein said address buffer circuits each comprise:

a first bipolar transistor having a base connected to a corresponding one of said address input terminals, and having a collector and an emitter, a second bipolar transistor having a base with a means to receive a reference voltage, an emitter connected to said emitter of said first bipolar transistor, and a collector, load elements connected to said collectors of said first and second bipolar transistors, respectively, a switching MOSFET having a source-drain path connected to said emitters of said first and second bipolar transistors, and a gate with means to receive said prescribed timing pulses, and a current source MOSFET having a source-drain path connected to said source-drain path of the switching MOSFET and a gate with means to receive a predetermined voltage.

13. A semiconductor integrated circuit device according to claim 1, wherein said at least one memory cell includes a static memory cell having a flip-flop circuit for storing data therein.

14. A semiconductor integrated circuit device according to claim 13, wherein said flip-flop circuit includes:

a first MOSFET having a gate and a drain, a second MOSFET having a gate connected to said drain of said first MOSFET, and a drain connected to said gate of said first MOSFET, and first and second load means connected to said drains of said first and second MOSFETs, respectively.

15. A semiconductor integrated circuit device according to claim 14, wherein said first and second load means include resistors of poly silicon.

16. A semiconductor integrated circuit device according to claim 14, wherein said first and second MOSFETs are of N-channel, wherein said first and second load means include first and second P-channel MOSFETs, wherein said first P-channel MOSFETs has a source-drain path connected to said gate of said first MOSFET, and wherein said second P-channel MOSFETs has a source-drain path connected to said drain of said second MOSFET, and a gate connected to said gate of said second MOSFET.

17. A semiconductor integrated circuit device according to claim 8, wherein said address buffer includes a plurality of unit circuits, and wherein each of said plurality of unit circuits includes:
- a first bipolar transistor having a base connected to the corresponding one of the supplied address signals, a collector and an emitter,
- a second bipolar transistor having a base with means to receive a reference voltage, an emitter connected to said emitter of said first bipolar transistor, and a collector,
- load elements connected to said collectors of said first and second bipolar transistors, respectively,
- a switching MOSFET having a source-drain path connected to said emitters of said first and second bipolar transistors, and a gate having means to receive said timing pulses, and
- a current source MOSFET having a source-drain path connected in series to said source-drain path of the switching MOSFET and a gate with means to receive a predetermined voltage.

18. A semiconductor integrated circuit device according to claim 10, wherein said plurality of memory cells include static memory cells each having a flip-flop circuit for storing data therein.

19. A semiconductor integrated circuit device according to claim 18, wherein said flip-flop circuit includes:
- a first MOSFET having a gate and a drain, wherein said first MOSFET corresponds to one of said MOSFETs by which said plurality of memory cells are composed,
- a second MOSFET having a gate connected to said drain of said first MOSFET, and a drain connected to said gate of said first MOSFET, wherein said second MOSFET corresponds to one of said MOSFETs by which said plurality of memory cells are constituted, and
- first and second load means connected to said drains of said first and second MOSFETs, respectively.

20. A semiconductor integrated circuit device according to claim 19, wherein said first and second MOSFETs are of N-channel, wherein said first and second load means include first and second P-channel MOSFETs, wherein said first P-channel MOSFETs has a source-drain path connected to said drain of said first MOSFET, and a gate connected to said gate of said first MOSFET, and wherein said second P-channel MOSFETs has a source-drain path connected to said drain of said second MOSFET, and a gate connected to said gate of said second MOSFET.

* * * * *